(12) United States Patent
Tsai et al.

(10) Patent No.: US 9,196,642 B2
(45) Date of Patent: Nov. 24, 2015

(54) STRESS RELEASE LAYOUT AND ASSOCIATED METHODS AND DEVICES

(71) Applicant: Taiwan Semiconductor Manufacturing Company, Ltd., Hsin-Chu (TW)

(72) Inventors: Tsung-Han Tsai, Zhunan Township (TW); Allen Tseng, Kao Hsiung (TW); Yen-Hsung Ho, Zhongli (TW); Chun-Hao Chou, Tainan (TW); Kuo-Cheng Lee, Tainan (TW); Volume Chien, Sinying (TW); Chi-Cherng Jeng, Madou Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 63 days.

(21) Appl. No.: 13/708,625

(22) Filed: Dec. 7, 2012

(65) Prior Publication Data

US 2014/0070352 A1    Mar. 13, 2014

Related U.S. Application Data

(60) Provisional application No. 61/698,992, filed on Sep. 10, 2012.

(51) Int. Cl.
*H01L 27/146* (2006.01)
*H01L 21/00* (2006.01)
*H01L 31/18* (2006.01)

(52) U.S. Cl.
CPC .............. *H01L 27/146* (2013.01); *H01L 31/18* (2013.01); *H01L 31/1804* (2013.01); *H01L 27/14636* (2013.01); *Y02E 10/547* (2013.01)

(58) Field of Classification Search
USPC ...................... 257/428–466, 620; 438/57–98
See application file for complete search history.

(56) References Cited

U.S. PATENT DOCUMENTS

| 5,539,257 | A  | * | 7/1996  | Hara et al.   | 257/775 |
| 6,177,293 | B1 | * | 1/2001  | Netzer et al. | 438/73  |
| 6,653,717 | B2 | * | 11/2003 | Jain et al.   | 257/632 |
| 2011/0227186 | A1 |   | 9/2011  | Chang et al.  |         |

* cited by examiner

*Primary Examiner* — Julio J Maldonado
*Assistant Examiner* — Cory Eskridge
(74) *Attorney, Agent, or Firm* — Slater & Matsil, L.L.P.

(57) ABSTRACT

An embodiment semiconductor device includes a substrate such as a silicon or silicon-containing film, a pixel array supported by the substrate, and a metal stress release feature arranged around a periphery of the pixel array. The metal stress release feature may be formed from metal strips or discrete metal elements. The metal stress release feature may be arranged in a stress release pattern that uses a single line or a plurality of lines. The metal stress release pattern may also use metal corner elements at ends of the lines.

20 Claims, 6 Drawing Sheets

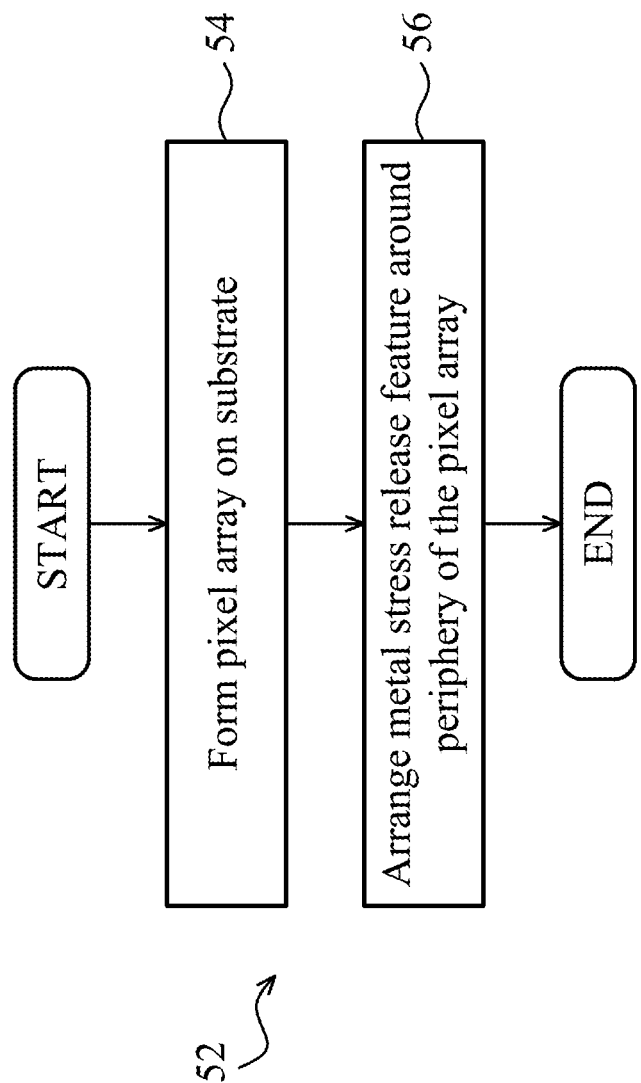

STRESS RELEASE LAYOUT AND ASSOCIATED METHODS AND DEVICES

CROSS-REFERENCE TO RELATED APPLICATIONS

This application claims the benefit of U.S. Provisional Application No. 61/698,992, filed on Sep. 10, 2012, entitled "Stress Release Layout and Associated Methods and Devices," which application is hereby incorporated herein by reference.

BACKGROUND

A complementary metal-oxide-semiconductor (CMOS) image sensor (CIS) generally utilizes a series of photodiodes formed within an array of pixel regions of a semiconductor substrate in order to sense when light has impacted the photodiode. Adjacent to each of the photodiodes within each of the pixel regions, a transfer transistor may be formed in order to transfer the signal generated by the sensed light within the photodiode at a desired time. Such photodiodes and transfer transistors allow for an image to be captured at a desired time by operating the transfer transistor at the desired time.

The CIS may be formed in either a front side illumination (FSI) configuration or a back-side illumination (BSI) configuration. In a front-side illumination configuration, light passes to the photodiode from the "front" side of the image sensor where the transfer transistor has been formed. However, forcing the light to pass through any overlying metal layers, dielectric layers, and past the transfer transistor before it reaches the photodiode may generate processing and/or operational issues as the metal layers, dielectric layers, and the transfer transistor may not necessarily be translucent and easily allow the light to pass through.

In the BSI configuration, the transfer transistor, the metal layers, and the dielectric layers are formed on the front side of the substrate and light is allowed to pass to the photodiode from the "back" side of the substrate. As such, the light hits the photodiode before reaching the transfer transistor, the dielectric layers, or the metal layers. Such a configuration may reduce the complexity of the manufacturing of the image sensor and improve the image sensor operation.

Unfortunately, the semiconductor substrate, which may be a silicon film or a silicon layer, is subjected to stress. The stress may lead to undesirable results such as, for example, the delamination of films or layers that overly the semiconductor substrate.

BRIEF DESCRIPTION OF THE DRAWINGS

For a more complete understanding of the present disclosure, and the advantages thereof, reference is now made to the following descriptions taken in conjunction with the accompanying drawings, in which:

FIG. 7 an embodiment method of forming the CIS of FIG. 1 is illustrated.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

The present disclosure will be described with respect to some embodiments in a specific context, namely a complementary metal-oxide-semiconductor (CMOS) image sensor (CIS) in a back-side illumination (BSI) configuration. The concepts in the disclosure may also apply, however, to other semiconductor structures or circuits or to any thin film manufacturing process wherein peeling and delamination is a concern.

Figure 1:
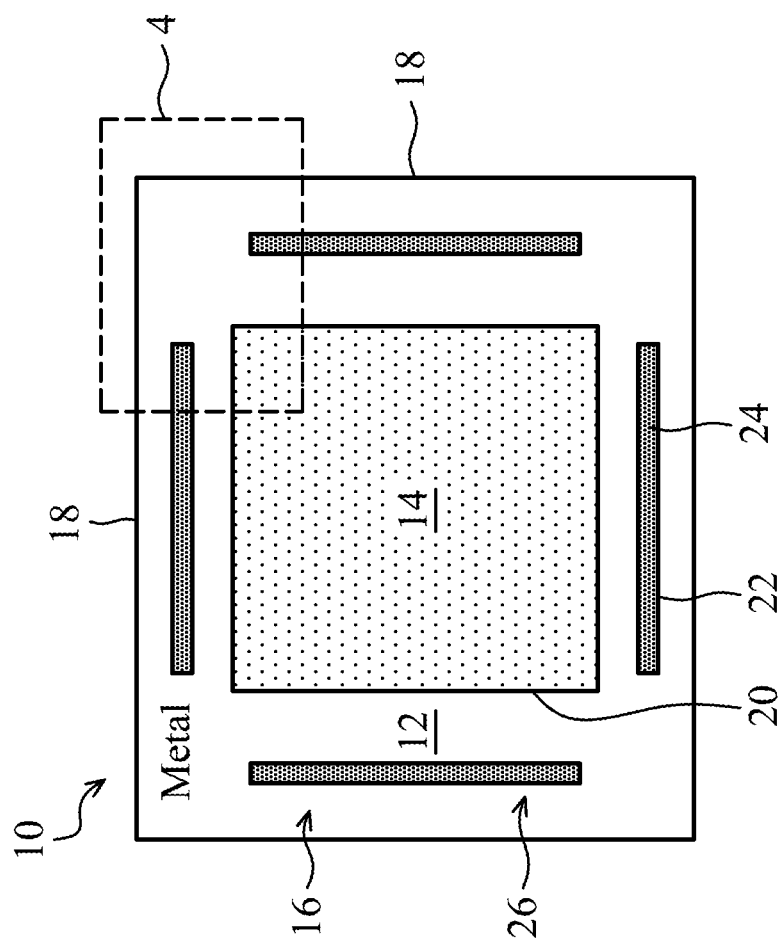
FIG. 1 is an top plan view of an embodiment complementary metal-oxide-semiconductor (CMOS) image sensor (CIS) in a back-side illumination (BSI) configuration in an intermediate state of manufacture and having a metal stress release feature.

Referring to FIG. 1, an embodiment complementary metal-oxide-semiconductor (CMOS) image sensor (CIS) 10 in a back-side illumination (BSI) configuration in an intermediate state of manufacture is illustrated. Notably, various films, layers, and features of the CIS 10, including photodiodes, lenses, color filters, anti-reflective coating (ARC), intermetal dielectrics, interlevel dielectrics, a supporting substrate, electronic circuitry, and the like are omitted from the figures for the sake of clarity, as they are not necessary to an understanding of the present disclosure.

As shown in FIG. 1, the CIS 10 includes a substrate 12, a pixel array 14, and a metal stress release feature 16. In an embodiment, the substrate 12 is a silicon substrate (e.g., silicon film) or a substrate containing one or more layers of silicon or other semiconductor material. Other substrates are within the contemplated scope of the disclosure. The substrate 12 may have a variety of different shapes, including square, rectangular, circular, and so on. As shown, the substrate 12 generally defines a substrate periphery 18.

Still referring to FIG. 1, the pixel array 14 supports or incorporates a photodiode (not shown) and corresponding image sensor circuitry (e.g., transistor, etc.). The pixel array 14 may have a variety of different shapes, including square, rectangular, circular, and so on. As shown, the pixel array 14 generally defines a pixel periphery 20.

As shown in FIG. 1, the metal stress release feature 16 is arranged around the piel periphery 20 of the pixel array 14. In other words, the metal stress release feature 16 generally surrounds or encircles the pixel array 14. In an embodiment, the metal stress release feature 16 is disposed on all sides of the pixel array 14. However, the metal stress release feature 16 may also be formed on less than all sides of the pixel array 14 in some embodiments. In an embodiment, the metal stress release feature 16 and the pixel array 14 are formed on the same surface of the substrate 12 or are generally co-planar, such that the pixel array 14 and the metal stress release feature 16 is positioned below the lowermost interlayer dielectric (ILD) and the lowermost metallization layer M1.

Still referring to FIG. 1, the metal stress release feature 16 may be formed from a single line 22 of metal strips 24 that generally progresses around the pixel periphery 20 of the pixel array 14. As shown, the single line 22 of metal strips 24 may be arranged in a stress release pattern 26 (e.g., a square, etc.). In the embodiment of FIG. 2, the metal strips 24 of the metal stress release feature 16 are substantially uniform and substantially straight, with each metal strip 24 running roughly the length of each respective side of the pixel array 14. The metal stress release feature 16 arranged in the stress release pattern 26 on the substrate 12 of the CIS 10 inhibits or prevents film delamination due to shear stress.

Figure 2A:
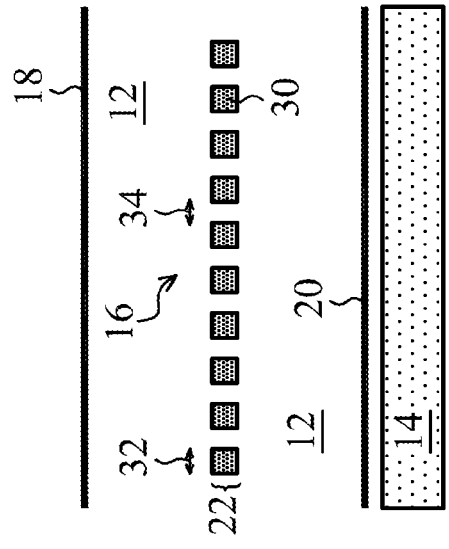
FIGS. 2a-2d illustrate various alternate arrangements for the metal stress release feature of FIG. 1.

Referring now to FIG. 2a, the metal stress release feature 16 may be formed from several lines 22a, 22b of metal strips 24 encircling or progressing around the pixel array 14 as shown in FIG. 1. In an embodiment, the lines 22a, 22b of the metal strips 24 may be concentric with each other. By way of example, the metal strips 24 in the outer line 22b in FIG. 2a generally lie outward of, and run parallel to, the metal strips 24 in the inner line 22a. In an embodiment, the distance 28 between the metal strip 24 in the outer line 22b and the metal strip 24 in the inner line 22a is at least 1 μm. While two lines 22a, 22b of metal strips 24 are shown in FIG. 2b, additional lines may be used in other embodiments.

Figure 2B:
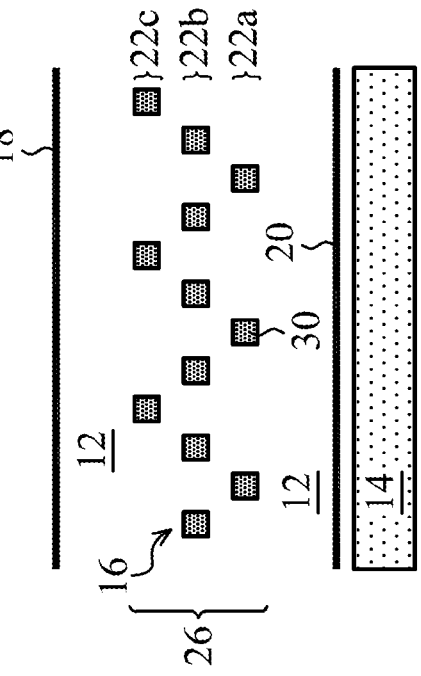

Referring now to FIG. 2b, the metal stress release feature 16 may be formed from a single line 22 of discrete metal elements 30. As shown, the discrete metal elements 30 are generally spaced apart from each other in the single line 22. In an embodiment, a distance 32 between adjacent ones of the discrete metal elements 30 is at least 1 μm. In an embodiment, each of the discrete metal elements 30 has a width 34 of at least 1 μm.

Figure 2C:
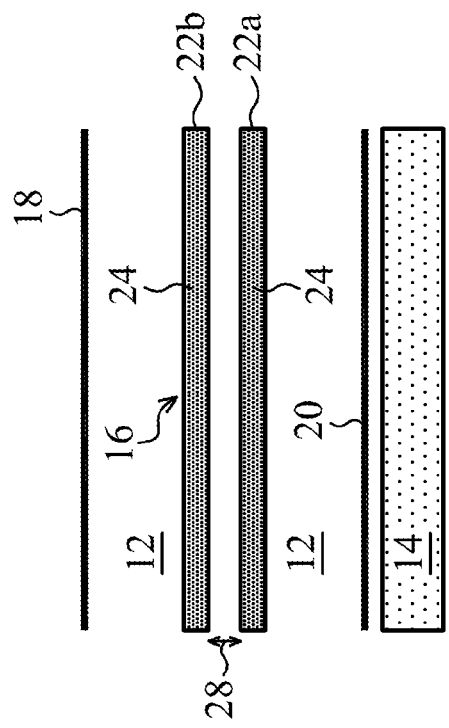

Referring now to FIG. 2c, the metal stress release feature 16 may be formed from several lines 22a, 22b of discrete metal elements 30. In an embodiment, the lines 22a, 22b of the discrete metal elements 30 may be concentric with each other. By way of example, the metal strips 24 in the outer line 22b in FIG. 2c generally lie outward of, and run parallel to, the metal strips 24 in the inner line 22a. In an embodiment, the distance 36 between the discrete metal elements 30 in the outer line 22b and the discrete metal elements 30 in the inner line 22a is greater than 1 μm. While two lines 22a, 22b of discrete metal elements 30 are shown in FIG. 2c, additional lines may be used in other embodiments.

Figure 2D:
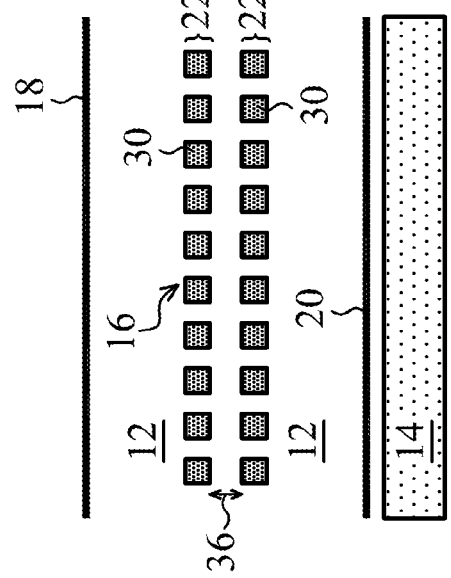

Referring now to FIG. 2d, the discrete metal elements 30 may be arranged in a zig-zag type stress release pattern 26. Indeed, as shown in FIG. 2d, the discrete metal elements 30 are organized into an inner line 22a, an intermediate line 22b, and an outer line 22c with the intermediate line 22b using different lateral spacing between the adjacent discrete metal elements 30 relative to the inner and outer lines 22a, 22c.

It should be recognized that a variety of different configurations may be used for the stress release pattern 26 in order to inhibit or prevent stress in the CIS 10. For example, dotted line in a zig-zag shapes or solid line zig-zag shapes could also be employed. In embodiments of two or more lines, the two or more lines could also be of complimentary zig-zag shapes.

Figure 3:
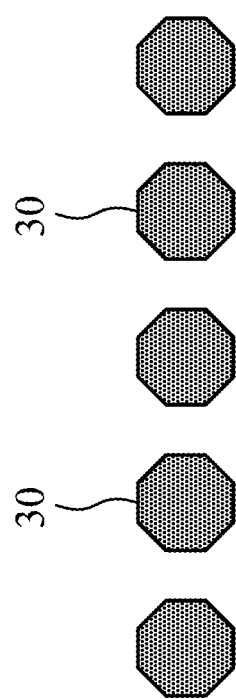
FIG. 3 illustrates one of the various shapes that discrete metal elements forming the metal stress release feature of FIGS. 2b-2d make take.

Referring now to FIG. 3, the discrete metal elements 30 depicted in FIGS. 2b-2d may have a variety of different shapes. For example, in an embodiment each of the discrete metal elements 30 has the shape of a square, a circle, an octagon, or some other polygon.

Figure 4:
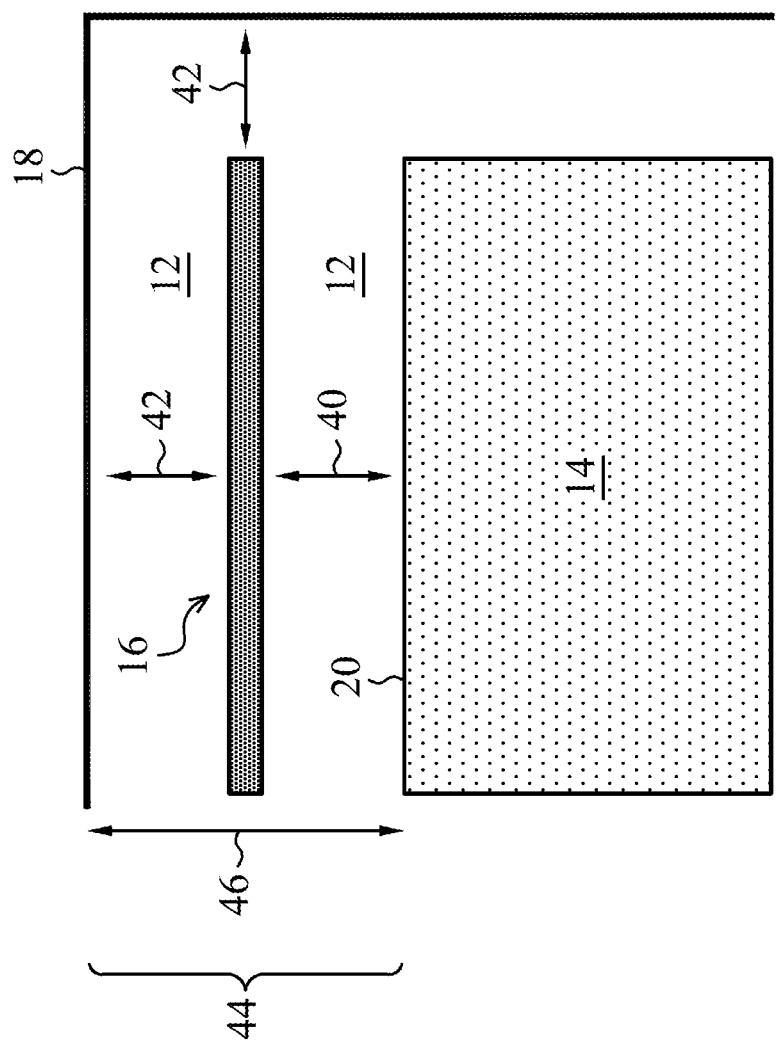
FIG. 4 illustrates various dimensions for the metal stress release feature of FIG. 1.

Referring now to FIG. 4, various dimensions for the metal stress release feature 16 are depicted. In an embodiment, the metal stress release feature 16 is spaced apart from the pixel periphery 20 of the pixel array 14 by a distance 40 of at least 100 μm. In addition, in an embodiment the metal stress release feature 16 is spaced apart from the substrate periphery 18 of the substrate 12 by a distance 42 of at least 100 μm in each direction. In an embodiment, the metal stress release feature 16 is disposed in a stress release layout region 44. As shown, the stress release layout region 44 generally extends between the pixel periphery 20 and the substrate periphery 18. In an embodiment, the stress release layout region 44 has a width 46 of about 300 μm.

Figure 6:
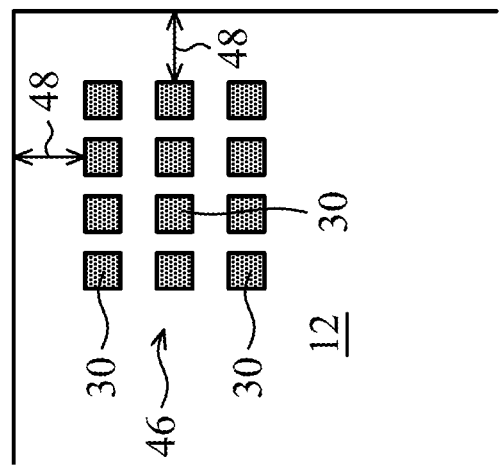
FIG. 6 illustrates the metal corner elements of FIG. 5 formed using discrete metal elements.
Figure 5:
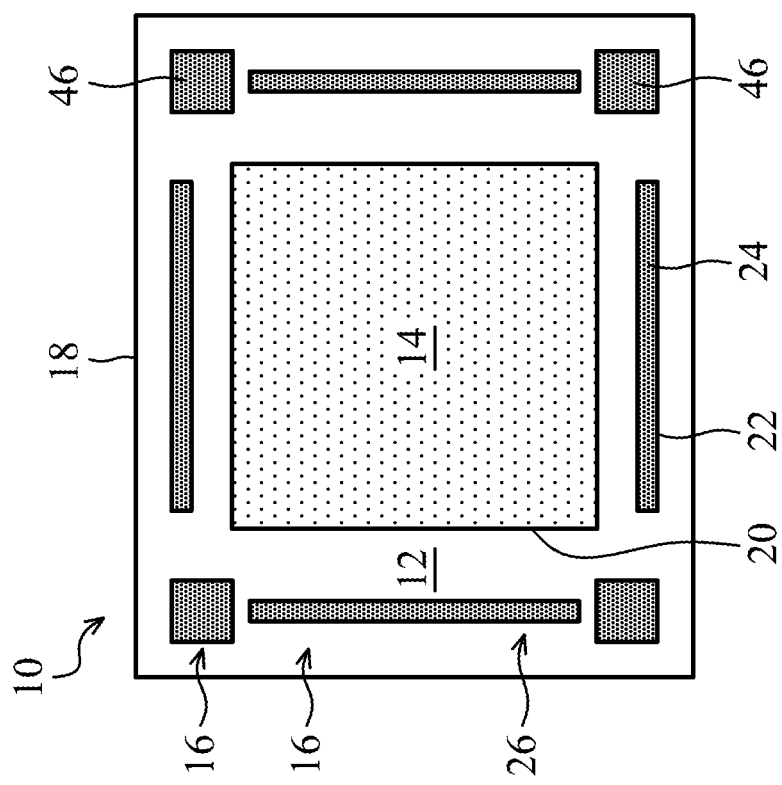
FIG. 5 illustrates an embodiment metal stress feature including metal corner elements.

Moving on to FIG. 5, in an embodiment the metal stress release feature 16 also includes metal corner elements 46. As shown, the metal corner elements 46 are disposed at or proximate the corners of the pixel array 14 and terminal ends of the lines 22. Indeed, as shown in FIG. 5, in an embodiment the metal strips 24 form lines 22 that extend between the metal corner elements 46. While the metal corner elements 46 are formed from a single unitary piece of metal in FIG. 5, the metal corner elements 46 may also be formed from a plurality of discrete metal elements 30 as shown in FIG. 6. While the discrete metal elements 30 forming the metal corner element 46 in FIG. 6 are collectively square, other shapes are also possible.

As shown in FIG. 6, in an embodiment the metal corner element 46, regardless of whether formed from a single piece of metal or several discrete metal elements 30, is spaced apart from the substrate periphery 18 of the substrate 12 by a distance 48 of at least 1 μm in both directions. In addition, in an embodiment the discrete metal elements 30 forming the metal corner element 46 are also spaced apart from each other by a distance 50 of at least 1 μm.

In an embodiment, the metal stress release features 16 disclosed herein are formed from, for example, tungsten, titanium, tantalum, aluminum, gold, platinum, palladium, and other suitable conductors that are compatible with the manufacturing processes employed in production of the resulting CIS 10. In some embodiments, the metal stress release features 16 may be formed from copper or a copper alloy.

In an embodiment, the metal stress release features 16 may be formed by blanket depositing and then patterning a metal layer. In other embodiments, the metal stress release features 16 may be formed by selectively depositing a metal such as, for example, by plating a metal on a patterned seed layer.

Referring now to FIG. 7, an embodiment method 52 of forming a semiconductor device (e.g., the CIS 10) is provided. In block 54, the pixel array 14 is formed on the silicon substrate 12. In block 56, the metal stress release feature 16 is arranged around the pixel periphery 20 of the pixel array 14. Thereafter, other films, layers, and features may be formed over the pixel array 14 and the metal stress release feature 16 supported by the substrate 12.

It is believed that these stress release features will reduce or prevent peeling and delamination of thin films, layers, or features subsequently formed over the substrate 12 surface on/in which the pixel array 14 is formed by reducing or eliminating sheer stress. One skilled in the art will recognize that the spacing and dimensions identified herein are typically specific to a particular technology node and minimum critical dimension scheme. As such, these dimensions are provided for illustration only, but should not be construed as limiting.

An embodiment semiconductor device includes a substrate, a pixel array supported by the substrate, and a metal stress release feature arranged around a periphery of the pixel array.

An embodiment semiconductor device includes a silicon film, a pixel array formed in the silicon film, and a metal stress release feature formed in the silicon film, the stress release feature arranged in a stress release pattern around a periphery of the pixel array.

An embodiment method of forming a semiconductor device includes forming a pixel array on a silicon substrate, and arranging a metal stress release feature around a periphery of the pixel array.

While the disclosure provides illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:

1. A semiconductor device, comprising:
   a semiconductor substrate;
   a pixel array disposed within the semiconductor substrate;
   one or more metal stress release features on the semiconductor substrate and arranged around a periphery of the pixel array, the one or more stress release features comprising at least one continuous strip parallel to a side of the pixel array; and
   an interlayer dielectric layer over the pixel array and the one or more metal stress release features, the interlayer dielectric layer being a lowermost interlayer dielectric layer.

2. The semiconductor device of claim 1, wherein the one or more metal stress release features comprise a single strip along a side of the pixel array.

3. The semiconductor device of claim 1, wherein the one or more metal stress release features comprise at least two lines of metal strips.

4. The semiconductor device of claim 1, wherein the one or more metal stress release features comprise a plurality of discrete metal elements in a single line.

5. The semiconductor device of claim 1, wherein the one or more metal stress release features comprise a plurality of discrete metal elements in at least two lines.

6. The semiconductor device of claim 1, wherein the one or more metal stress release features comprise a plurality of discrete metal elements in a zig-zag pattern.

7. The semiconductor device of claim 1, wherein the one or more metal stress release features are spaced apart from a periphery of the pixel array and a periphery of the substrate by at least 100μm.

8. The semiconductor device of claim 1, wherein the one or more metal stress release features comprise a plurality of discrete metal elements spaced apart from each other by at least 1 μm.

9. The semiconductor device of claim 1, wherein the one or more metal stress release features comprise a plurality of discrete metal elements, each of the discrete metal elements having a width of at least 1μm.

10. The semiconductor device of claim 1, wherein the one or more metal stress release features include metal corner elements and at least one of metal strips and discrete metal elements forming lines extending between the corner elements.

11. The semiconductor device of claim 1, wherein the one or more metal stress release features comprise a plurality of discrete metal elements having a shape of at least one of square, circular, octagon.

12. A semiconductor device, comprising:
    a silicon substrate;
    a pixel array formed on the silicon substrate; and
    a metal stress release feature formed on the silicon substrate, the stress release feature interposed between a periphery of the silicon substrate and a periphery of the pixel array, the metal stress release feature comprising at least one metal line, the metal stress release feature being between a lowermost metallization layer M1 and the silicon substrate.

13. The semiconductor device of claim 12, wherein the metal stress release feature comprises discrete metal elements.

14. The semiconductor device of claim 12, wherein the stress release feature is one of metal strips and discrete metal elements disposed in a plurality of concentric lines.

15. The semiconductor device of claim 12, wherein the metal stress release feature is spaced apart from the periphery of the pixel array by at least 100μm.

16. The semiconductor device of claim 12, wherein the metal stress release feature is disposed in a stress release layout region between the periphery of the pixel array and the periphery of the silicon substrate, the stress release layout region having a width of about 300 μm.

17. The semiconductor device of claim 12, wherein the stress release feature includes corner elements and at least one of metal strips and discrete metal elements arranged in a line extending between the corner elements.

18. A method of forming a semiconductor device, comprising:
    forming a pixel array on a silicon substrate;
    forming a metal stress release feature on the silicon substrate around a periphery of the pixel array, the metal stress release feature comprising a metal line;
    forming an interlayer dielectric layer over the pixel array and the metal stress release feature; and
    forming a lowermost metallization layer M1 over the interlayer dielectric layer.

19. The method of claim 18, wherein the metal stress release feature comprises discrete metal elements arranged in a line.

20. The method of claim 18, wherein the metal stress release feature comprises corner elements and a plurality of concentric metal strips or discrete metal elements arranged in a line, the metal stress release feature spaced apart from the pixel array by at least 100μm and the metal strips or discrete metal elements arranged in a line spaced apart from each other by at least 1 μm.

* * * * *